Dec. 25, 1962 C. S. FULLER ET AL 3,070,467
TREATMENT OF GALLIUM ARSENIDE
Filed March 30, 1960
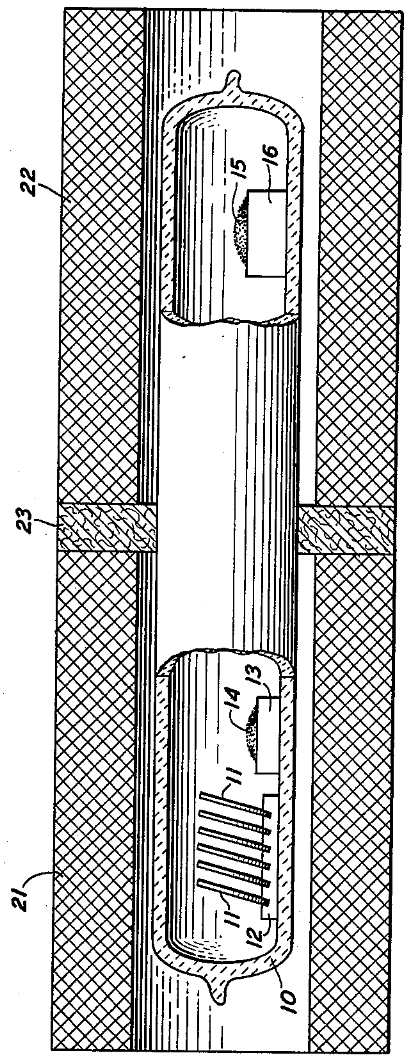
INVENTORS C. S. FULLER
J. M. WHELAN
BY H. W. Lockhart
ATTORNEY United States Patent Office 3,070,467

Patented Dec. 25, 1962

3,070,467

TREATMENT OF GALLIUM ARSENIDE

Calvin S. Fuller, Chatham, and James M. Whelan, North Plainfield, N.J., assignors to Bell Telephone Laboratories, Incorporated, New York, N.Y., a corporation of New York Filed Mar. 30, 1960, Ser. No. 18,584
1 Claim. (Cl. 148—1.5)

This invention relates to methods for fabricating semiconductor devices and, more particularly, to methods of altering the conductivity of gallium arsenide semiconductor bodies.

The advantageous properties of gallium arsenide for use as a semiconductor material are well known. These properties include a wider forbidden energy band gap than the more commonly used group IV materials, germanium and silicon, as well as desirable temperature characteristics. However, in the fabrication of devices using gallium arsenide material, the high vapor pressure of arsenic presents a problem. At the elevated temperatures required for diffusion and alloying treatments there is considerable evaporation of arsenic from the gallium arsenide material being treated. In addition to the erosion of the surface of the material, this evaporation produces small droplets or puddles of gallium which combine with the dopants which are being introduced to affect the conductivity of the material to form eutectics which then alloy into the semiconductor material. The general result is gallium arsenide material having a very poor surface as well as nonuniform distribution of the diffusing or alloying dopants within the material close to the surface.

In accordance with this invention, means are provided for substantially preventing this deleterious evaporation of arsenic from the base material during treatments at elevated temperatures.

Therefore, a broad objective of this invention is improved gallium arsenide semiconductor devices and an ancillary object is to enable heat treatment of gallium arsenide semiconductor material without deleterious loss of arsenic from the base material.

In one specific embodiment of the method of this invention, slices of single crystal gallium arsenide of P-type conductivity are mounted in a quartz tube. A specific quantity of an N-type significant impurity, for example, tin, is also placed n the tube. Next, a specific amount of solid arsenic is inserted in the tube. The quantity of arsenic introduced is based on the amount which upon vaporization will provide an arsenic vapor pressure equal to, or in excess of, the equilibrium vapor pressure over the gallium arsenide at the temperature of the diffusion treatment. The tube next is flushed with an inert gas, evacuated to a very low pressure and sealed.

The quartz tube with its contents then is heated at a temperature in the range from about 800 to 1220 degrees centigrade for a prolonged period, ranging up to several days. After the completion of this treatment, the gallium arsenide slices are removed from the container and have an N-type conductivity surface layer which has a depth dependent upon the time and temperature of the diffusion treatment. The slices are then processed further by the selective removal of material and ultimate fabrication of the individual wafers into semiconductor devices by the attachment of electrodes.

The introduction of a specific amount of arsenic into the diffusion chamber provides a suitable over-pressure of arsenic vapor which inhibits evaporation of arsenic from the slice material. It is important that the arsenic pressure provided be neither so high that it will affect undesirably the diffusion process, nor so low that the base material will be eroded as a consequence of arsenic evaporation.

Thus, a feature of the invention is the provision of a positive arsenic vapor pressure within the container used for the diffusion treatment and, more specifically, the provision of the predetermined amount of arsenic to produce the optimum pressure for erosionless diffusion.

In another specific embodiment of the invention, a source of arsenic may be provided at one end of the container which is maintained at a lower temperature than that at the opposite end where the semiconductor slices are located and where the diffusion process occurs. In this arrangement the arsenic vapor pressure is a function of the lower of the two temperatures of the system and the use of a precise quantity of arsenic is unncessary but the temperature of the source becomes important.

The invention and its other objects and features will be more clearly understood from the following description taken in connection with the drawing which shows in schematic form, and partially in section, apparatus for carrying out the invention.

Referring to the FIGURE, there is shown an elongated quartz tube 10 mounted in a tubular furnace having two sections 21 and 22 separated by a thermally insulating divider 23. Within the tube 10 at one end, corresponding to furnace section 21, is mounted a quartz holder 12 containing a number of slices 11 of single crystal N-type gallium arsenide approximately one-quarter inch in diameter and 25 mils (1 mil=.001 inch) thick. Typically, the gallium arsenide has a specific resistivity of about two ohm centimeters. Located in proximity to the gallium arsenide material in a quartz boat 13 is a quantity 14 of P-type significant impurity, for example, zinc. Typically, the amount supplied is 200 micrograms of zinc per cubic centimeter of the diffusion vessel. Also in the tube 10 at the opposite end, corresponding to furnace section 22, is a second quartz boat 16 containing a measured quantity of powdered arsenic 15. For example, using a quartz tube having a diameter of six millimeters and a length of five centimeters equal to a volume of approximately one cubic centimeter, 12 milligrams of arsenic produce a desirable arsenic vapor pressure of between two and four atmospheres at a diffusion temperature of 1100 degrees centigrade. For treatments at lower temperatures the quantity of arsenic needed is smaller. For a diffusion temperature of 1000 degrees centigrade about ten milligrams of arsenic is used.

The heating apparatus shown in the drawing is adapted to either a two-temperature system in which furnace sections 21 and 22 are maintained at different temperatures or a single-temperature arrangement in which both furnace sections are heated to the same temperature and the insulating divider is unnecessary. The latter arrangement is used in the method first described herein.

The quartz tube next is flushed with argon, evacuated to an air pressure of about .001 millimeter of mercury, and sealed. The furnace temperature then is raised to within the range between 800 degrees and 1220 degrees centigrade and maintained for a period of about one hour or less. At the conclusion of this heat treatment, the container is cooled and opened and the gallium arsenide slices removed. Each slice now has a diffused P-type surface layer to a depth of several mils and may be fabricated into a number of wafers suitable for incorporation into semiconductor devices by selective removal of material and attachment of electrodes.

In accordance with other known techniques, certain significant impurities may be provided for the diffusion process by direct preplating on selected surfaces of the gallium arsenide slices. Specifically, silver, which is an acceptor element in gallium arsenide, may be provided in this fashion rather than as a vapor in the tube.

In one specific example, gallium arsenide slices of N-type conductivity having a thickness of about 150 mils and a resistivity of two ohm centimeters were cut from a one-quarter inch diameter zone-leveled rod. One surface of each slice was lapped and etched to a polished condition and then electroplated with silver to a thickness sufficient to be clearly visible. Typically, this corresponds to a silver plating of about 500 micrograms per square inch. The slices were then placed in a quartz tube, such as described above, with 12 milligrams of arsenic. The tube then was flushed with argon, evacuated to 0.001 millimeter of mercury air pressure and sealed. The tube and its contents were then heated at 1100 degrees centigrade for ten minutes. Upon removal the slices were found to have a PN junction at a depth of 40 mils from the silver plated surface with a surface which showed substantially no deterioration. Similar slices heated identically, but without excess arsenic, showed severe pitting of the surfaces in places reaching depths of ten mils.

In another specific example, a circular slice of N-type gallium arsenide of three millimeters radius and one millimeter thickness and having a resistivity of 0.1 ohm centimeter was sealed after the standard flushing and evacuation in a quartz tube of about one cubic centimeter capacity with 500 micrograms of zinc and 11 milligrams of arsenic. Before the slice was put in the tube, its surfaces were polished carefully by grinding and etching successively in hydrofluoric-nitric acid and in aqua regia solutions. After heating the assembly for ten minutes at 1052 degrees centigrade, the gallium arsenide slice was found to have a P-type surface layer of about 1.9 mils thickness with a PN junction located at that depth.

In another specific example, using 0.1 ohm centimeter P-type conductivity gallium arsenide, slices similar in size to that above were sealed in evacuated quartz tubes each with 250 micrograms of tin. The inclusion of 12 milligrams of arsenic in the container provided an arsenic pressure of about two atmospheres at the diffusion temperature of 1065 degrees centigrade. After heat treatment for six hours, the slices were removed and found to have an N-type surface layer of about 0.1 mil thickness. Rectifiers fabricated from this slice material exhibited a reverse breakdown voltage of about one volt.

The technique of this invention in another aspect is useful for the fabrication of highly doped or degenerate gallium arsenide semiconductor material. Such material, having carrier concentrations of $10^{19}$ per cubic centimeter, is desirable for making Esaki or tunnel devices. For example, a slice of single crystal P-type gallium arsenide, one-quarter inch in diameter and ten mils thick and having a resistivity of 0.1 ohm centimeter, was prepared by customary lapping and etching procedures. The slice was placed in a flushed quartz tube, having a volume of about one cubic centimeter, with 50 micrograms of zinc metal and ten milligrams of elementary arsenic and the tube was sealed. The tube and its contents were heated at about 1000 degrees centigrade for ten hours. Upon the conclusion of this treatment, the slice was substantially saturated with zinc so as to have a carrier concentration of the order of $10^{19}$ per cubic centimeter. After cleaning to remove deposited zinc and arsenic, the slice was divided into wafers to each of which a small quantity of tin was alloyed at 750 degrees centigrade to produce a number of tunnel diodes.

Although the temperature range for diffusion of dopants into gallium arsenide is from about 800 to 1200 degrees centigrade, it is apparent from the foregoing examples that the most advantageous treatment temperatures are in the range from about 1000 to 1100 degrees centigrade. This is particularly the case for the dopants referred to, namely, silver, zinc and tin.

In all of the foregoing specific examples, evidence of the beneficial effect of the excess arsenic was afforded by comparison with a parallel treatment omitting the excess arsenic. In each instance a significantly greater degree of surface damage occurred in the absence of an excess arsenic vapor pressure.

An alternative procedure for carrying out the invention utilizes the apparatus of the figure as a two-temperature system. In accordance with this arrangement, a copious amount of arsenic 15 is placed in the boat 16. After evacuating and sealing the container 10, the left-hand section 21 of the furnace is raised to the diffusion temperature at between 800 and 1220 degrees centigrade. The right-hand section 22 of the furnace, however, is raised to a lower temperature than that of the left-hand section, typically, about 600 degrees centigrade. The temperature of the right-hand section 22 is chosen so as to maintain an arsenic vapor pressure within the container in excess of the equilibrium vapor pressure over the compound. In this variation of the method of the invention, precise measurement of a specified quantity of arsenic is not required, but rather precise control of the arsenic vapor pressure is achieved by maintaining the arsenic source at a selected temperature. More specifically, for a diffusion at a temperature as low as 800 degrees centigrade the equilibrium vapor pressure would be 0.02 atmosphere. By heating the arsenic source end at about 500 degrees centigrade, an arsenic vapor pressure of about 60–70 millimeters of mercury (about 0.08 to 0.1 atmosphere) is produced. A suitable temperature range for the right-hand section 22 of the furnace is from about 450 degrees centigrade and 650 degrees centigrade.

In a further variation of the foregoing procedures and using the apparatus of the figure, a specified amount of arsenic is provided within the container as in the procedure first described above. However, the left-hand section 21 of the furnace is heated to a temperature lower than that of the right-hand section 22 but sufficiently high to keep all the arsenic in the vapor phase. Thus, the temperature of the left-hand section 21 of the furnace controls the vapor pressure of the dopant being diffused. This method is particularly useful for treatments at lower temperatures.

The method of this invention is most advantageous when used for the diffusion of the metallic elements, for example, the acceptor impurities, silver and zinc, and the donor impurity, tin. The technique may be useful under appropriate conditions of pressure, temperature and quantity of diffusant with the donor impurities, sulfur, selenium and tellurium.

Although the foregoing description has been in terms of the diffusion treatment of gallium arsenide to alter its conducting properties, it will be understood that the method of this invention involving the provision of a positive arsenic pressure applies as well to other processes which involve heating and the consequent evaporation of arsenic from the base material. Thus, the invention may find application in certain alloying processes in connection with gallium arsenide. Therefore, although the invention has been described in connection with one specific embodiment, it will be understood that other techniques may be devised by those skilled in the art which will be within the scope and spirit of the invention.

What is claimed is:

In the fabrication of PN junctions in gallium arsenide semiconductor bodies the steps of polishing a surface of a body of N-type conductivity gallium arsenide, electroplating silver to a thickness corresponding to about 500 micrograms per square inch on said polished surface, placing the body of gallium arsenside in a container with about 12 milligrams of arsenic, flushing said container with argon, evacuating and sealing said container, heating the container at a temperature of about 1100 degrees centigrade for about ten minutes to diffuse silver into a portion of said body to convert said portion to P-type conductivity, and cooling and removing said body from the container.

References Cited in the file of this patent

UNITED STATES PATENTS

| | | |
|---|---|---|
| 2,898,248 | Silvey et al. | Aug. 4 1959 |
| 2,928,761 | Gremmelmaier et al. | Mar. 15, 1960 |
| 2,995,475 | Sharpless | Aug. 8, 1961 |

OTHER REFERENCES

Semiconductor Abstracts, vol. 5, 1957, Battelle Memorial Institute, New York, p. 276, No. 1066.